(12) United States Patent
Sorkine et al.

(10) Patent No.: US 8,485,723 B2
(45) Date of Patent: Jul. 16, 2013

(54) ONE-TIME SENSOR DEVICE

(75) Inventors: Evgeni Sorkine, Moscow (RU); Brian L. Clothier, Wichita, KS (US)

(73) Assignee: TSI Technologies LLC, Wichita, KS (US)

( * ) Notice: Subject to any disclaimer, the term of this patent is extended or adjusted under 35 U.S.C. 154(b) by 319 days.

(21) Appl. No.: 12/853,973

(22) Filed: Aug. 10, 2010

(65) Prior Publication Data

US 2011/0038395 A1     Feb. 17, 2011

Related U.S. Application Data

(60) Provisional application No. 61/273,976, filed on Aug. 12, 2009.

(51) Int. Cl.
*G01K 7/00* (2006.01)

(52) U.S. Cl.
USPC .......................................... 374/163; 374/176

(58) Field of Classification Search
USPC ............... 374/200, 207.11, 207.22, 228, 100, 374/141, 208, 120, 121, 163, 176; 250/338.1; 324/200, 207.11, 207.33, 228; 340/870.17
See application file for complete search history.

(56) References Cited

U.S. PATENT DOCUMENTS

| | | | |
|---|---|---|---|
| 4,134,538 A | 1/1979 | Lagarde et al. | |
| 5,019,801 A * | 5/1991 | Anderson, III | 340/522 |
| 5,202,665 A | 4/1993 | Hafele | |
| 5,653,742 A | 8/1997 | Parker et al. | |
| 6,441,737 B1 | 8/2002 | Antonenco et al. | |
| 6,556,139 B2 | 4/2003 | Manov et al. | |
| 6,622,913 B1 | 9/2003 | Antonenco et al. | |
| 6,666,821 B2 | 12/2003 | Keimel | |
| 6,747,559 B2 | 6/2004 | Antonenco et al. | |
| 6,837,620 B2 | 1/2005 | Shahinpoor | |
| 7,183,917 B2 * | 2/2007 | Piccoli et al. | 340/572.1 |
| 7,354,645 B2 | 4/2008 | Liebermann et al. | |
| 7,689,260 B2 | 3/2010 | Finch et al. | |

(Continued)

FOREIGN PATENT DOCUMENTS

| WO | WO2004083798 A1 | 9/2004 |
|---|---|---|
| WO | WO 2007134061 A2 * | 11/2007 |

OTHER PUBLICATIONS

International Search Report and Written Opinion; PCT/US2010/045253; dated Apr. 28, 2011.

(Continued)

*Primary Examiner* — Lisa Caputo
*Assistant Examiner* — Roger Hernandez-Prewitt
(74) *Attorney, Agent, or Firm* — Hovey Williams LLP

(57) ABSTRACT

One-time, single-use sensor elements (22, 46) are provided for detecting the occurrence of predetermined conditions such as temperature and elapsed time-temperature. The sensor elements (22, 46) preferably comprise elongated, glass-coated, metal alloy, amorphous or nanocrystalline microwires (30, 48), which can be placed in a position to detect the predetermined condition of interest. An alternating magnetic field detector (28) may be used to continuously or periodically interrogate the sensor elements (22, 46) to determine if the predetermined condition has occurred. In one aspect of the invention, the microwires (30, 48) experience a change in configuration upon the occurrence of the predetermined condition, and have correspondingly different induced remagnetization responses. In another embodiment, a static microwire is provided having an initial bi-stable single domain; when a predetermined time-temperature condition is experienced, multiple domains are established in the microwire, and this can be detected by the detector (28).

14 Claims, 3 Drawing Sheets

U.S. PATENT DOCUMENTS

| | | |
|---|---|---|
| 2005/0109435 A1 | 5/2005 | Liebermann et al. |
| 2007/0263699 A1 | 11/2007 | Clothier et al. |
| 2008/0175753 A1 | 7/2008 | Clothier |
| 2010/0006562 A1 | 1/2010 | Clothier |

OTHER PUBLICATIONS

Antonenko et al, High Frequency Properties of Glass-Coated Microwires, Journal of Applied Physics, vol. 83, 6587-89.

Donald et al., The Preparation, Properties and Applications of Some Glass Coated Metal Filaments Prepared by the Taylor-Wire Process, Journal of Materials Science, 31, 1139-48 (1996).

Horia Chirac, Preparation and Characterization of Glass Covered Magnetic Wires, Materials Science and Engineering A304-306, 166-71 (2001).

Wiesner and Schneider, Magnetic Properties of Amorphous Fe—P Alloys Containing Ga, Ge, and As, Phys. Stat. Sol.(a) 26, 71 (1974).

A. Zhukov, J. González, J. M. Blanco, M. Vázquez and V. Larin (2000). Microwires coated by glass: A new family of soft and hard magnetic materials. Journal of Materials Research, 15, pp. 2107-2113. doi:10.1557/JMR.2000.0303. (Abstract only).

* cited by examiner

ONE-TIME SENSOR DEVICE

CROSS-REFERENCE TO RELATED APPLICATION

This application claims the benefit of provisional application Ser. No. 61/273,976, filed Aug. 12, 2009. These prior applications are incorporated by reference herein in their entirety.

BACKGROUND OF THE INVENTION

1. Field of the Invention

The present invention is broadly concerned with one-time, one-use sensor assemblies designed to determine the occurrence of predetermined conditions, such as temperature values. More particularly, the invention is concerned with such assemblies and methods making use of specially designed, elongated, resilient sensor elements (preferably amorphous or nanocrystalline metal alloy glass-coated microwires). A separate detector includes a transmitter unit operable to transmit interrogating electromagnetic radiation (preferably an alternating magnetic field) to the sensor elements, and changes in the induced responses of the sensor elements indicate occurrence of the predetermined condition.

2. Description of the Prior Art

A number of one-time sensor devices have been developed in the past for use in monitoring and detecting predetermined conditions, such as temperature changes, the impact of chemical or biological agents, radiation exposure, electromagnetic fields, and structural stresses. For example, U.S. Pat. No. 6,837,620 discloses a sensor element formed of shape memory alloy, which changes shape when exposed, even temporarily, to temperatures below a predetermined critical temperature. The shape change of the element causes the sensor to change between two readily distinguishable states, such as a color change in the sensor device. However, this sensor requires a rather complicated mechanical arrangement, and has a relatively large size.

Another example of a one-time sensor device is a radiation badge indicating a cumulative ionizing radiation dose experienced by the wearer. As ionizing radiation is experienced, a film forming a part of the badge absorbs such radiation. This film, when developed, indicates the cumulative radiation dose by its blackness grade. While being reliable, the reading process is time-consuming and inconvenient.

U.S. Pat. No. 6,666,821 describes an implantable sensor system with a sensor including a protective member preventing the sensor from interacting with the surrounding environment. At a selected time, the protective member is disabled by application of an electrical potential serving to dissolve the member. In another embodiment, the protective member dissolves within a body over a predetermined time period.

U.S. Pat. No. 7,689,260 describes an extended use, slowly implantable microwire electrode, which is coated with temperature-sensitive shape memory polymer. A drawback of these sensors is the need to directly couple the microwire electrode to electrical leads, making it impossible to wirelessly communicate with the electrode. A similar type of implantable device is described in U.S. Pat. No. 5,653,742.

U.S. Patent Publications 2008/0175753 and 2010/0006562 describe glass-coated microwire sensors designed for wireless communication by means of an alternating magnetic field detector. These devices are not single use sensors. There is accordingly a need in the art for a relatively inexpensive, one-time sensor unit operable to indicate the occurrence of a predetermined event, such as temperature or the like.

SUMMARY OF THE INVENTION

The present invention overcomes the problems outlined above and provides inexpensive, highly reliable one-time sensors for detecting a variety of predetermined conditions, the operation of which can be detected wirelessly using electromagnetic radiation.

Generally speaking, the sensors of the invention include one or more elongated, metal alloy sensor microwires which have characteristic responses when interrogated by an electromagnetic radiation detector. In one aspect of the invention, the sensors employ sensor microwires which are initially placed in a first constrained orientation, such as a coil or serpentine configuration. Upon the occurrence of a predetermined condition, the sensor microwires assume a second, different orientation, such as a substantially rectilinear configuration. This change in configuration, and thus the occurrence of the predetermined condition, is detected by an interrogating alternating magnetic field. In the first orientation, the sensor microwires exhibit a first (generally lower) induced remagnetization response, whereas in the second orientation, they exhibit a second (generally higher) induced remagnetization response. This change in response indicates the occurrence of the predetermined condition.

In another aspect, static time-temperature condition sensor elements are provided which are initially fabricated and deployed as metal alloy, amorphous, or nanocrystalline microwires exhibiting a single, bi-stable domain and a substantially square hysteresis loop. Upon experiencing a predetermined time-temperature condition, the sensor microwires are altered to exhibit a plurality of domains and a substantially flat hysteresis loop. Operation of such time-temperature sensor elements can be detected using an alternating magnetic field detector. Prior to experiencing the time-temperature condition, the sensor microwire exhibits a characteristic induced remagnetization response. Upon experiencing the time-temperature condition, no such remagnetization response is exhibited. This response difference indicates the occurrence of the time-temperature condition.

DETAILED DESCRIPTION OF THE PREFERRED EMBODIMENT

Embodiment of FIGS. 1-4

Turning now to the drawings, a one-time sensor unit 20 is depicted in FIGS. 1-4. Generally, the sensor unit 20 includes an elongated, resilient sensor element 22 with a support 24. Structure such as temperature sensitive adhesive 26 is provided to hold the sensor element 22 in a first configuration (see FIGS. 1 and 3) on the support 24. In the illustrated embodiment, the sensor element 22 is initially positioned in a serpentine pattern, although any suitable other pattern could be employed. The sensor element 22 is operable to assume a second configuration different than the first configuration in the event that a predetermined condition occurs. In the exemplary embodiment, the sensor unit 20 is designed to sense the occurrence of a predetermined temperature. When such a temperature is experienced, the adhesive 26 melts, thereby freeing the element 22 from the first condition. In such event, the sensor element 22 assumes a substantially rectilinear configuration depicted in FIG. 2. Again, any suitable second configuration could be chosen.

The sensor element 22 should have two distinguishing characteristics. First, it should be formed of resilient material having the capability to be initially configured and held, but which assumes a second, different configuration in the event of the occurrence of the predetermined condition. Second, the sensor element 22 should be responsive to interrogating electromagnetic radiation, in order to give a first response to the radiation when the sensor element is in the first configuration thereof, and a second response different from the first response when the sensor element is in its second configuration.

Figure 11:
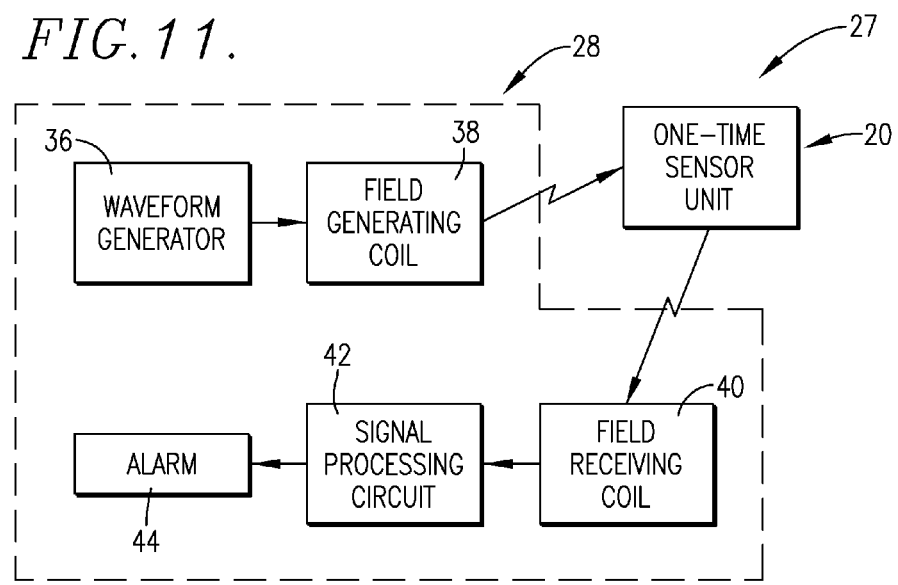
FIG. 11 is a schematic illustration of a preferred sensor assembly in accordance with the invention, including a one-time sensor element and an alternating magnetic field detector.

A complete sensor assembly 27 is illustrated schematically in FIG. 11 and includes the sensor unit 20, as well as a detector 28. Broadly speaking, the detector 28 is designed to generate the appropriate interrogating electromagnetic radiation which is received by the sensor unit 20. It also includes a receiver operable to receive the induced responses from the sensor unit. A variety of such detectors can be used, depending upon the type of sensor element 22 chosen and the appropriate electromagnetic signals needed to communicate with the sensor element.

In particularly preferred forms, the sensor element 22 is in the form of an elongated amorphous or nanocrystalline metal alloy sensor microwire 30 having a positive magneto striction property and different remagnetization responses, depending upon the configuration of the microwire. Advantageously, the microwire 30 has a glass sheath or coating 32.

Glass-coated amorphous sensor microwires have been used in the past in the context of electronic article surveillance (EAS) and authentication systems. Such sensor microwires, their production, magnetic properties, and behaviors, have been disclosed in the technical and patent literature. See, for example, U.S. Pat. Nos. 6,441,737 and 6,747,559; Horia Chirac, *Preparation and Characterization of Glass Covered Magnetic Wires*, Materials Science and Engineering A304-306, 166-71 (2001); Donald et al., *The Preparation, Properties and Applications of Some Glass Coated Metal Filaments Prepared by the Taylor-Wire Process*, Journal of Materials Science, 31, 1139-48 (1996); Wiesner and Schneider, *Magnetic Properties of Amorphous Fe—P Alloys Containing Ga, Ge, and As*, Phys. Stat. Sol. (a) 26, 71 (1974); and Antonenko et al, *High Frequency Properties of Glass-Coated Microwires*, Journal of Applied Physics, vol. 83, 6587-89. Continuous lengths of sensor microwires have been produced inexpensively by what is generally called in the art the Taylor process whereby either a pre-alloyed ingot or the required elemental constituents are melted in a generally vertically disposed glass tube that is sealed at the bottom. Once the alloy is converted to a molten state, using radio frequency ("rf") heating for example, the softened bottom of the glass tube is grasped and drawn continuously. Rapid reduction of alloy cross-section, together with use of secondary cooling means, causes the alloy to become amorphous or nanocrystalline during drawing.

A typical sensor microwire may have a total diameter (both the wire core and glass coating) of perhaps 20-70 microns. The alloy core and glass coating can be physically coupled to each other continuously or only at several spatially separated points. The glass-to-metal ratio, though variable, can be tightly controlled. For example, the typical thickness of a glass coating may be from about 1-5 microns for a 45-60 micron core diameter microwire, and typically 1-3 microns for 30 micron core diameter microwire. Sensor microwire elements for prior art EAS and authentication tags are usually cut to lengths ranging from 15 mm to 75 mm.

Prior art glass-coated amorphous sensor microwires produced by the Taylor method can be fabricated so as to exhibit very low coercivities (substantially less than 10 A/m), high relative permeabilities (substantially higher than 20000), substantially zero or slightly positive magnetostrictions, and large Barkhausen discontinuities (which means that the microwires exist essentially only in bimodal magnetic states). The remagnetization properties of sensor microwires are also important and can be adjusted based upon the makeup of the core alloy and the other physical parameters of the sensor microwires.

See also, U.S. Pat. Nos. 6,556,139; 4,134,538; 6,622,913; 6,556,139 (incorporated by reference herein in its entirety); and U.S. Pat. No. 7,354,645; Published Application 2005/0109435; and Zukov et al., J. Mater. Res. 15, No. 10, October 2000.

The above-described microwires are suitable for use in the present invention, and would typically have a length of from about 10-100 mm. A variety of alloys can be used for the creation of the microwire 30, but Co-based (75.5% Co) alloys also containing 4.5% Fe, 6% B, and 12% Si have been found to be useful.

The support 24 may be formed of any suitable material, such as a strip of paper stock 34. Alternately, a synthetic resin support may be utilized. Indeed, any appropriate material may be employed, so long as it does not interfere with the operation of sensor element 22 or the wireless communication between the sensor unit 20 and detector 28.

The detector 28 in this embodiment includes an AC waveform generator 36 coupled with a field generating coil or coil assembly 38. The field coil is employed to generate an alternating magnetic field which magnetically couples with the microwire 30 in order to induce remagnetization responses therefrom. The detector 28 further includes a field receiving coil or coil assembly 40, a signal processing circuit 42, and an alarm 44. The coil 40 is designed to receive the remagnetization responses from the microwire 30, while the circuit 42 at least partially analyzes the remagnetization responses. In the event that a predetermined condition is sensed, the alarm 40 is activated. Depending upon the nature of the circuit 36, a display may also be coupled via an interface (not shown) or, if necessary, a computer or other digital processing device, in order to complete the signal processing and generate a readable display. The alarm 44 can of course be of any type, such as audio, visual, or computer-generated. The detector 28 is typically actuated repeatedly over time in order to monitor the sensor unit 20.

Preferably, the circuit 42 operates using a decoding algorithm having the capability to decode the magnetic field perturbation information received upon interrogation of the microwire 30. The decoding algorithm may be in the form of one or more look-up tables stored within memory associated with the circuit 42, so that the remagnetization response data may be translated into usable information.

Figure 1:
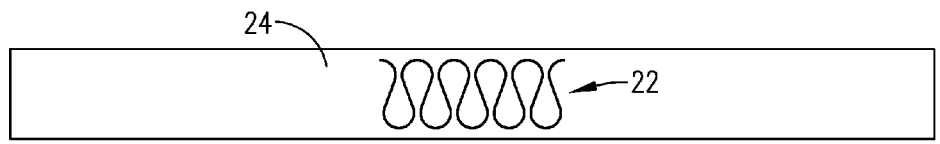
FIG. 1 is a plan view of a one-time sensor assembly operable to sense the occurrence of a predetermined condition and comprising a resilient sensor element mounted on a support, with the sensor element maintained in a first configuration.
Figure 2:
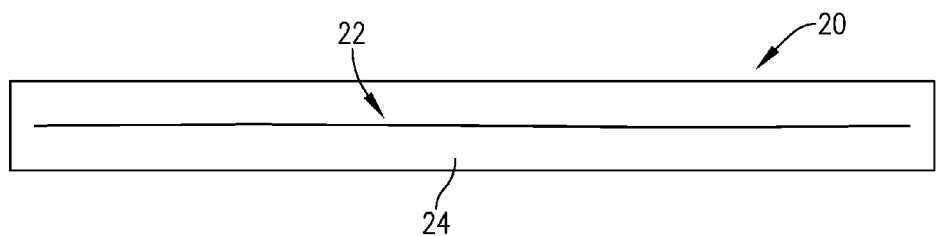
FIG. 2 is a plan view similar to that of FIG. 1, but illustrating the sensor element in a second configuration after sensing of the predetermined condition.
Figure 3:
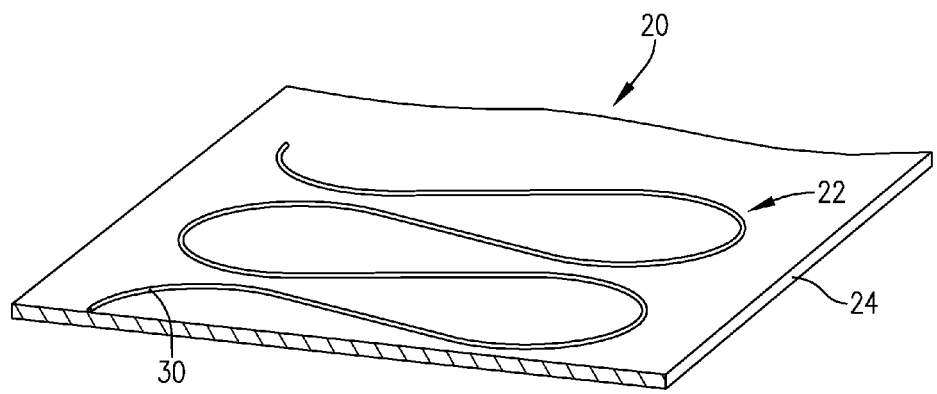
FIG. 3 is an enlarged, fragmentary perspective view of a sensor assembly of the type illustrated in FIGS. 1 and 2, wherein the sensor element is in the form of a glass-coated amorphous or nanocrystalline sensor microwire, with the microwire secured to the support by means of a temperature-sensitive adhesive.
Figure 4:
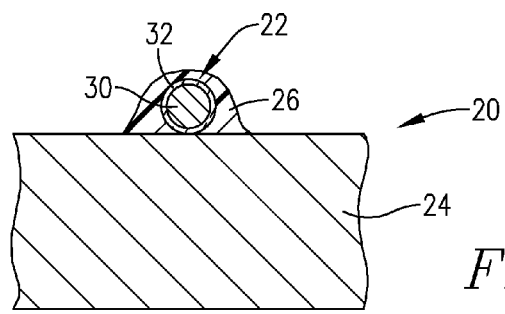
FIG. 4 is a greatly enlarged sectional view depicting the substrate, sensor microwire, and adhesive.

Use of the preferred microwire sensor element 22 and detector 28 results in different remagnetization responses when the sensor element 22 is in the first and second positions thereof. When the sensor element 22 is constrained, as illustrated in FIGS. 1 and 3, the remagnetization response thereof is reduced substantially and has a near- or zero voltage amplitude. However, when the predetermined condition is experienced by the sensor unit 20 and the sensor element 22 assumes its second configuration, the remagnetization response detected by detector 28 is much greater than the initial response. The substantial difference in voltage amplitude is then used as an indicator that the predetermined condition has occurred. Normally, the remagnetization responses of the microwire 30 are static. Therefore, low AC frequencies can be used in the detector 28, e.g., a few hundred Hertz to a few kiloHertz. These low frequency fields can penetrate carbon-filled composites and other structures without notable attenuation of the remagnetization response signals.

A one-time sensor assembly 27 was fabricated using a piece of glass-coated microwire 30 with the Co-based alloy described above. The microwire 30 had a metal core diameter of 32 microns with a total diameter (core plus glass coating) of 40 microns, and was 60 mm long. The microwire 30 was shaped in a serpentine fashion, such as is illustrated in FIG. 1, with a maximum pattern width of 4.5 mm, and a minimum bend radius of 1 mm. The bent microwire was glued using a hot melt adhesive 26 on a paper support 24.

Figure 9:
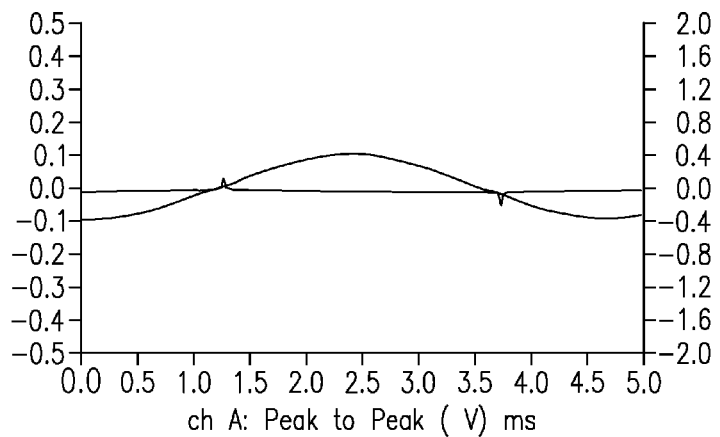
FIG. 9 is a graph illustrating the remagnetization response of a sensor assembly of the type illustrated in FIGS. 3-4 operable to sense the occurrence of a predetermined temperature, wherein the illustrated remagnetization response is a very low voltage amplitude.
Figure 10:
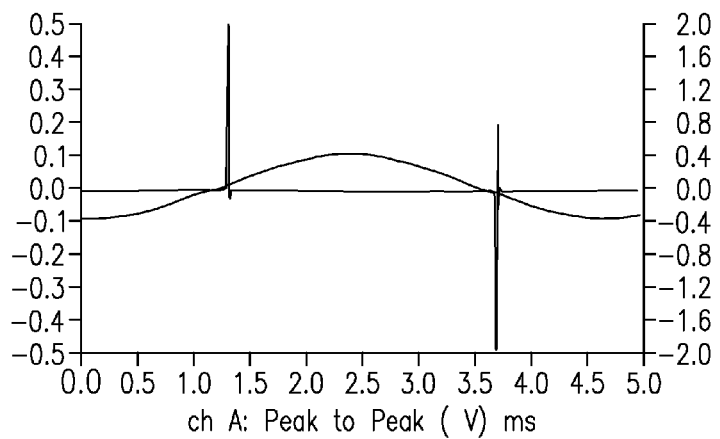
FIG. 10 is another graph illustrating the remagnetization response of the sensor assembly of FIGS. 3-4 after the occurrence of the predetermined temperature, wherein the illustrated remagnetization response is a very high voltage amplitude.

The sensor unit 20 was placed in a Helmholtz coil arrangement producing an AC magnetic field with an amplitude of 100 A/m of 217 Hz (depicted by a sine wave in FIG. 9). The remagnetization responses of the unit 20 were received by a small receiving coil, amplified, and registered by a digital online PICO ADC-200 oscilloscope. As seen in FIG. 9, the initial remagnetization amplitude was about 0.15 V. Thereupon, the sensor unit 20 was subjected to heating to 70° C. in order to melt the adhesive 26. At this point, the microwire 30 reverted to its original rectilinear configuration. In this condition, the sensor unit 20 was again placed in the Helmholtz coil arrangement, in order to ascertain the remagnetization response thereof. This response is illustrated in FIG. 10, where it will be seen that the remagnetization spike had an amplitude of over 2 V.

Embodiment of FIGS. 5-8

Figure 5:
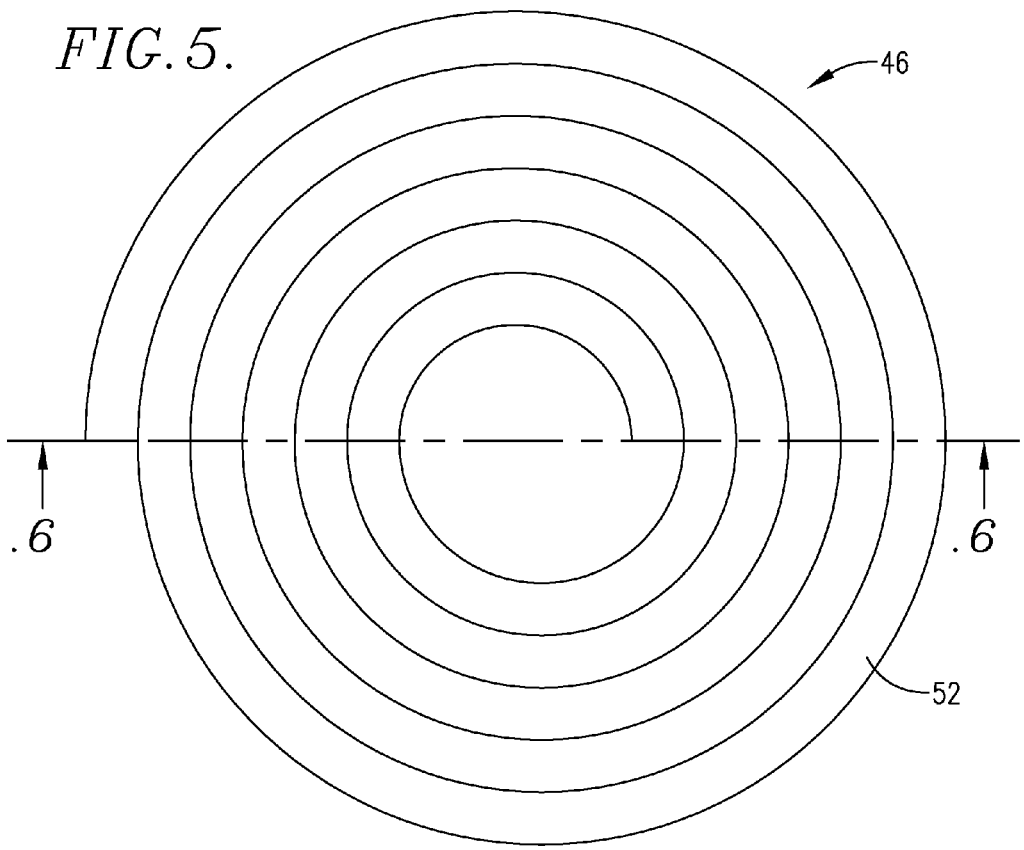
FIG. 5 is a plan view of another one-time sensor assembly in accordance with the invention, including a coiled, glass-coated amorphous or nanocrystalline sensor microwire, with a sheath of shape memory material about the sensor microwire.
Figure 6:
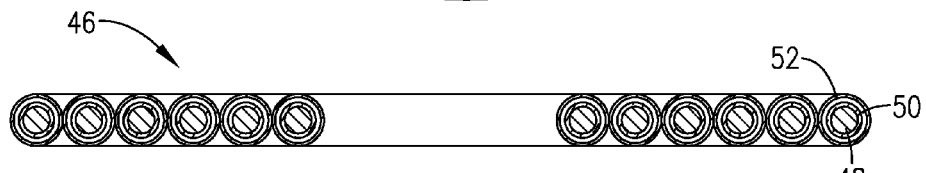
FIG. 6 is a sectional view taken along line 6-6 of FIG. 5.
Figure 7:
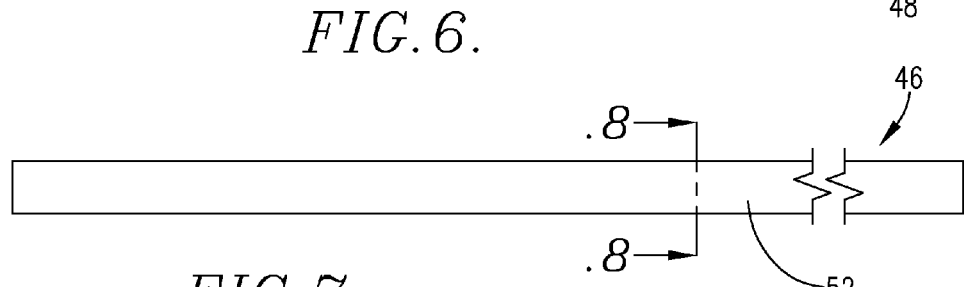
FIG. 7 is a fragmentary view of the sensor of FIG. 5, shown after detection of a predetermined condition with the sensor microwire assuming an uncoiled position.
Figure 8:
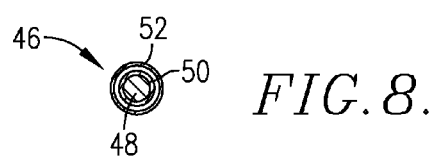
FIG. 8 is a sectional view taken along line 8-8 of FIG. 7.

FIGS. 5-8 illustrate a one-time microwire sensor element 46 in the form of a coil or spiral, as best depicted in FIG. 5. As in the first embodiment, the sensor element 46 includes a microwire 48 together with a surrounding coating of glass 50. The microwire 48 and glass coating 50 are preferably substantially rectilinear in the original state thereof. The sensor element 46 further includes a tubular sheath 52 of shape memory alloy or polymer, which is also preferably substantially rectilinear in its initial configuration. The sheath 52 is then slid onto the microwire and the assembly is bent to the more compact coil shape of FIG. 5. Of course, other shape variants, such as the serpentine shape of the first embodiment, may be used if desired. It will be observed that the sheath 52 rather loosely surrounds the glass-coated microwire, rather than being in full engagement therewith. The coiled microwire/shape memory sheath would also normally be mounted upon a support similar to the support 24

Preferably, the shape memory material should have a definitive transformation from the formed or bent configuration back to the initial memory configuration when it experiences a predetermined condition. This predetermined condition may be a temperature, an absorbed radiation wavelength or electric current magnitude, or some other predetermined condition.

When the predetermined condition is experienced, the glass-coated microwire within the sheath 52 is forced back to the original, substantially rectilinear configuration, (FIGS. 7 and 8) by the corresponding change in shape of the sheath 52. Detection of the transition of sensor unit 46 from the bent to the rectilinear configuration can be accomplished by the alternating magnetic field detector 28, previously described. That is, the remagnetization response of the central glass-coated microwire is substantially different in the coiled configuration versus the rectilinear configuration.

The sheath 52 may be formed from a shape memory alloy, such as Nitinol (NiTi alloys) available from SAES Memory Corporation or Johnson Matthey, Inc., or a shape memory polymer, such as linear block copolymers, crosslinked polyurethane, or PEO-PET (poly(oxyethtylene)-polyethylene terephthalate) crosslinked block copolymers. Shape memory materials of this type are extremely ductile below their As (Austenite starting transition) temperatures, but will maintain their maximum deformation state until raised above the Af (final transition) temperatures.

Other Embodiments

The embodiment of FIGS. 1-4 made use of an adhesive to initially constrain the sensor element 22 until a predetermined temperature was experienced. The embodiment of FIGS. 5-8 made use of the shape memory sheathing 52 to provide such initial constraint. Both of these embodiments relied upon a change in configuration of the sensor element 22 or 46, and a corresponding change in the alternating magnetic field-induced remagnetization responses of the elements between the constrained initial positions and the altered positions after experiencing a predetermined condition.

However, it is possible to provide one-time sensor elements without the use of either of these expedients, and indeed without relying upon any change in configuration of the sensor elements. Such simplified one-time sensor elements can be provided using a specially designed glass-coated microwire having an essentially zero magnetostriction and suitable metal alloy components. In this context, one-time "temperature history threshold" sensors may be provided which detect when a predetermined time-temperature condition has been experienced, e.g., when a predetermined temperature has been experienced for a predetermined elapsed time. As fabricated and initially deployed, the glass-coated microwire has a single magnetic domain aligned along the length of the microwire itself that can only exist at any given time in one of two stable magnetic states, namely a) a fully saturated state with the domain aligned in one axial direction parallel to the length of the wire, or b) a fully saturated state with the domain aligned in the opposite axial direction and parallel to the length of the wire. The transition between these two stable magnetic states occurs via a single Barkhausen jump, and accordingly the microwire remagnetization response induced by an interrogating alternating magnetic field features an essentially square hysteresis loop.

However, once the sensor microwire has been exposed to the predetermined time-temperature condition, the sensor microwire loses its square hysteresis loop characteristic (and thus its bi-stable magnetic state) in favor of a substantially flat hysteresis loop, with magnetic domains now oriented along the length of the sensor microwire in a circumferential, "bamboo-like" pattern. In this condition, the microwire will no longer create sharp magnetic field perturbations when interrogated by an alternating magnetic field.

One-time sensor microwires in this context are produced by a one-stage Taylor process directly from metal alloy melt. The resultant microwires feature very high tensile strengths and excellent elastic properties. As explained in U.S. Pat. No. 6,556,139 (incorporated by reference herein in its entirety), certain glass-coated microwires feature unique responses to alternating magnetic fields, owing to their single-domain structure. Furthermore, it has been found that chromium-containing glass-coated microwires, such as those described in U.S. Patent Publication No. 2007/0263699 (also incorporated by reference herein in its entirety), exhibit "switching" temperature differences depending upon the percentage of chromium therein. Higher chromium contents lead to reduced "switching" temperatures. For instance, a cobalt-based microwire with no chromium content has experimentally been found to maintain its characteristic Barkhausen jump feature (and thus its ability to produce a large induced remagnetization response) when exposed to a temperature of 350° C. for one hour. However, another microwire of the same chemical composition except for the addition of 3.6% chromium by weight lost its bi-stable state, and thus its square hysteresis loop characteristic and the ability to produce a sharp induced remagnetization pulse in an alternating magnetic field, after the same temperature-time exposure. Therefore, a desired time-temperature condition can be designed into glass-coated, amorphous or nanocrystalline metal alloy microwires, typically by adjusting the chromium content of the starting metal alloy. Empirical testing of such microwires would normally also be required to precisely tailor the time-temperature conditions of the sensor microwires. It will also be appreciated that the relationship between temperature and time is not necessarily linear, i.e., a sensor microwire designed to detect a 400° C. temperature over an elapsed time of one hour would not necessarily detect a time-temperature condition of 200° C. over two hours elapsed time.

The detector 28 is used to interrogate these time-temperature condition sensor microwires. If an induced remagnetization pulse response is detected, the sensor has not been exposed to the requisite time-temperature condition. If the detector later detects essentially no remagnetization response, then it can be inferred that the sensor has experienced the time-temperature condition designed into the sensor microwire.

A second reference sensor microwire can also be placed in proximity with a primary time-temperature condition sensor, wherein the reference sensor microwire is designed not to lose its bi-stable state under the time-temperature condition of the primary sensor microwire. In such a case, when the detector 28 detects two induced remagnetization pulse responses, then the primary sensor has not experienced the predetermined time-temperature condition thereof. When only a single induced remagnetization pulse response is detected, this signifies that the primary one-time sensor has experienced the requisite time-temperature condition.

The above embodiments have also focused on the use of a detector including an alternating magnetic field generator. However, the invention is not limited to these types of detection. For example, the configuration change of the embodiments of FIGS. 1-8 could be detected by microwave radiation of appropriate wavelength (e.g., double the length of the sensor microwire in its substantially rectilinear configuration). In this embodiment, the detection is accomplished by the amplitude of the microwave radiation reflected by the sensor microwire. The amplitude of the microwire in the constrained configuration is substantially different than that from the configuration assumed by the sensor after the occurrence of the predetermined condition.

Additionally, while the above description has focused on temperature and time-temperature condition sensors, it will be understood that a variety of conditions can be detected using the sensors of the invention. These would include values associated with electrical current or voltage, electromagnetic fields, radiation exposure, or the presence of chemical or biological agents. The sensors may be attached to or embedded within structures or objects, or may be simply placed in locations where the conditions of interest may be experienced. The fact that the sensors are designed for wireless, remote detection renders them uniquely valuable in a virtually limitless number of contexts.

We claim:

1. A sensor assembly operable for sensing a predetermined condition, said sensor assembly comprising:
   a sensor unit including:
   an elongated, resilient sensor element;
   a support for said sensor element;
   structure releasably holding said sensor element in a first configuration on said support,
   said sensor element operable to assume a second configuration different than said first configuration when said condition occurs; and
   a detector separate from said sensor element and including a transmitter unit operable to transmit interrogating electromagnetic radiation to said sensor element,
   said sensor element having a first response to said radiation when the sensor element is in said first configuration, and a second response different from said first response when the sensor element is in said second configuration,
   said sensor element comprising an amorphous or nanocrystalline sensor microwire having a positive magnetostriction property, said first and second responses being respective remagnetization responses;
   said detector operable to detect the difference between said first and second responses.

2. The sensor assembly of claim 1, said transmitter unit operable to create an alternating magnetic field of sufficient magnitude to magnetically couple with said sensor microwire in order to interrogate the sensor microwire and induce sensor microwire remagnetization responses, said detector further including a remagnetization sensor operable to sense the magnitude of said induced remagnetization responses.

3. The sensor assembly of claim 1, said first remagnetization response being a voltage amplitude of substantially zero, said second remagnetization response being a voltage amplitude substantially greater than zero.

4. The sensor assembly of claim 1, said sensor microwire being glass-coated.

5. The sensor assembly of claim 1, including a coating of shape memory material on said sensor element.

6. The sensor assembly of claim 1, said structure comprising adhesive releasably securing said sensor element to said support.

7. The sensor assembly of claim 1, said condition being a predetermined temperature experienced by said sensor element.

8. A method of detecting the occurrence of a predetermined condition, comprising the steps of:
placing a sensor unit in a position to sense said predetermined condition, said sensor unit including:
an elongated, resilient sensor element;
a support for said sensor element;
structure releasably holding said sensor element in a first configuration on said support,
said sensor element operable to assume a second configuration different than said first configuration when said condition occurs; and
interrogating said sensor element by transmitting interrogating electromagnetic radiation to said sensor element,
said sensor element having a first response to said radiation when the sensor element is in said first configuration, and a second response different from said first response when the sensor element is in said second configuration,
said sensor element comprising an amorphous or nanocrystalline sensor microwire having a positive magnetostriction property, said first and second responses being respective remagnetization responses; and
detecting said second response as an indication of occurrence of said predetermined condition.

9. The method of claim 8, including the steps of creating an alternating magnetic field of sufficient magnitude to magnetically couple with said sensor microwire in order to interrogate the sensor microwire and induce sensor microwire remagnetization responses, and detecting said induced remagnetization responses.

10. A one-time sensor element operable to sense a predetermined time-temperature condition, said sensor element comprising an elongated, amorphous or nanocrystalline metal alloy sensor microwire having a positive magnetostriction property, and a bi-stable single magnetic domain aligned along the length of the microwire which can exist at any given time in one of two stable magnetic states, said sensor microwire operable to lose its bi-stable single magnetic domain and have a plurality of magnetic domains oriented generally circumferentially along the length of the sensor microwire, when the sensor microwire experiences said predetermined time-temperature condition.

11. The sensor element of claim 10, said sensor microwire metal alloy containing chromium and having a glass coating.

12. A method of detecting a predetermined time-temperature condition, comprising the steps of:
placing a sensor element in a position to sense said predetermined time-temperature condition, said sensor element comprising an elongated, amorphous or nanocrystalline metal alloy sensor microwire having a positive magnetostriction property, and a bi-stable single magnetic domain aligned along the length of the microwire which can exist at any given time in one of two stable magnetic states, said sensor microwire operable to lose its bi-stable single magnetic domain and have a plurality of magnetic domains oriented generally circumferentially along the length of the sensor microwire, when the sensor microwire experiences said predetermined time-temperature condition; and
interrogating said sensor element by creating an alternating magnetic field of sufficient magnitude to magnetically couple with said sensor element and induce a response from the sensor element,
said sensor element exhibiting a remagnetization response prior to experiencing said predetermined time-temperature condition, and failing to exhibit a remagnetization response after experiencing said predetermined time-temperature condition.

13. The method of claim 12, said sensor microwire metal alloy containing chromium and having a glass coating.

14. The method of claim 12, including the step of placing a reference microwire in proximity to said sensor element, said reference microwire having a positive magnetostriction property and operable to maintain a bi-stable single magnetic domain aligned along the length of the microwire which can exist at any given time in one of two stable magnetic states both prior to and after said sensor element experiences said pre-determined time-temperature condition.

* * * * *